United States Patent
Onal et al.

(10) Patent No.: US 10,677,899 B2
(45) Date of Patent: Jun. 9, 2020

(54) AGGREGATING NON-IMAGING SPAD ARCHITECTURE FOR FULL DIGITAL MONOLITHIC, FRAME AVERAGING RECEIVERS

(71) Applicant: Waymo LLC, Mountain View, CA (US)

(72) Inventors: Caner Onal, Palo Alto, CA (US); Pierre-yves Droz, Los Altos, CA (US)

(73) Assignee: Waymo LLC, Mountain View, CA (US)

( * ) Notice: Subject to any disclaimer, the term of this patent is extended or adjusted under 35 U.S.C. 154(b) by 475 days.

(21) Appl. No.: 15/670,082

(22) Filed: Aug. 7, 2017

(65) Prior Publication Data

US 2019/0041502 A1    Feb. 7, 2019

(51) Int. Cl.
*G01S 7/48*      (2006.01)
*G01S 7/4863*    (2020.01)
(Continued)

(52) U.S. Cl.
CPC ........... *G01S 7/4863* (2013.01); *G01J 1/4228* (2013.01); *G01J 1/44* (2013.01); *G01S 7/4816* (2013.01); *H01L 27/14643* (2013.01); *H01L 31/02027* (2013.01); *H01L 31/107* (2013.01); *G01J 2001/4466* (2013.01); *H01L 27/1446* (2013.01)

(58) Field of Classification Search
USPC ................................................ 356/5.01, 5.03
See application file for complete search history.

(56) References Cited

U.S. PATENT DOCUMENTS 9,064,315 B2    6/2015    Meyers et al.
9,210,350 B2   12/2015    Dai et al.
(Continued)

FOREIGN PATENT DOCUMENTS

KR    10-2016-0142839      12/2016

OTHER PUBLICATIONS

M. -. Tétrault et al., "Real-Time Discrete Spad Array Readout Architecture for Time of Flight PET," in IEEE Transactions on Nuclear Science, vol. 62, No. 3, pp. 1077-1082, Jun. 2015.*
(Continued)

*Primary Examiner* — James R Hulka
(74) *Attorney, Agent, or Firm* — McDonnell Boehnen Hulbert & Berghoff LLP (57) ABSTRACT

The present disclosure relates to systems and methods that include a monolithic, single-chip receiver. An example system includes a plurality of macropixels, each made up of an array of single photon avalanche diodes (SPADs). The system also includes a plurality of pipelined adders communicatively coupled to a respective portion of the plurality of macropixels. The system additionally includes a controller configured to carry out operations. The operations include during a listening period, receiving, at each pipelined adder of the plurality of pipelined adders, respective photosignals from the respective portion of the plurality of macropixels. The operations also include causing each pipelined adder of the plurality of pipelined adders to provide an output that includes a series of frames that provide an average number of SPADs of the respective portion of the plurality of macropixels that were triggered during a given listening period.

20 Claims, 5 Drawing Sheets

(51) Int. Cl.
  *G01S 7/481* (2006.01)
  *G01J 1/44* (2006.01)
  *H01L 31/02* (2006.01)
  *H01L 31/107* (2006.01)
  *G01J 1/42* (2006.01)
  *H01L 27/146* (2006.01)
  *H01L 27/144* (2006.01)

(56) References Cited

U.S. PATENT DOCUMENTS

| | | | |
|---|---|---|---|
| 9,392,259 B2 | 7/2016 | Borowski | |
| 9,516,244 B2 | 12/2016 | Borowski | |
| 9,628,735 B2 | 4/2017 | Zhang et al. | |
| 9,639,063 B2 | 5/2017 | Dutton et al. | |
| 9,819,913 B2 * | 11/2017 | Chandra | H04N 5/347 |
| 9,819,930 B2 * | 11/2017 | Sun | H04N 5/374 |
| 2013/0293681 A1 * | 11/2013 | Borowski | G01S 7/483 348/46 |
| 2013/0300838 A1 * | 11/2013 | Borowski | G01S 7/486 348/46 |
| 2014/0049783 A1 * | 2/2014 | Royo Royo | G01S 7/4816 356/601 |
| 2014/0119651 A1 * | 5/2014 | Meyers | G06T 5/007 382/167 |
| 2015/0041625 A1 * | 2/2015 | Dutton | G01T 1/2985 250/208.1 |
| 2015/0163429 A1 * | 6/2015 | Dai | H04N 5/3535 348/295 |
| 2016/0047904 A1 * | 2/2016 | Mellot | G01S 7/4865 356/5.03 |
| 2016/0353084 A1 | 12/2016 | Sun et al. | |
| 2016/0373676 A1 * | 12/2016 | Zhang | H04N 5/374 |
| 2017/0064223 A1 | 3/2017 | Chandra et al. | |

OTHER PUBLICATIONS

C. Niclass, M. Soga, H. Matsubara, S. Kato and M. Kagami, "A 100-m Range 10-Frame/s 340 $\,\times\,$96-Pixel Time-of-Flight Depth Sensor in 0.18-$\mu\hbox{m}$ CMOS," in IEEE Journal of Solid-State Circuits, vol. 48, No. 2, pp. 559-572, Feb. 2013.*

International Searching Authority, International Search Report and Written Opinion dated Dec. 7, 2018, issued in connection with International Patent Application No. PCT/US2018/044979, filed on Aug. 2, 2018, 9 pages.

* cited by examiner

Top View

Side View

AGGREGATING NON-IMAGING SPAD ARCHITECTURE FOR FULL DIGITAL MONOLITHIC, FRAME AVERAGING RECEIVERS

BACKGROUND

Unless otherwise indicated herein, the materials described in this section are not prior art to the claims in this application and are not admitted to be prior art by inclusion in this section.

Light detection and ranging (LIDAR) devices may estimate distances to objects in a given environment. For example, an emitter subsystem of a LIDAR system may emit near-infrared light pulses, which may interact with objects in the system's environment. At least a portion of the light pulses may be redirected back toward the LIDAR (e.g., due to reflection or scattering) and detected by a receiver subsystem. Conventional receiver subsystems may include a plurality of detectors and a corresponding controller configured to determine an arrival time of the respective light pulses with high temporal resolution (e.g., ~400 ps). The distance between the LIDAR system and a given object may be determined based on a time of flight of the corresponding light pulses that interact with the given object.

SUMMARY

The present disclosure relates to systems and methods that include a monolithic, single-chip receiver. The single-chip receiver may be operable as an all-digital "LIDAR engine-on-a-chip." Exemplary systems and methods utilizing such architectures need not include a frontend incorporating analog circuitry. Instead, the monolithic LIDAR receiver may be operable to receive the digital or digital-like signal from the SPAD arrays and perform all other signal processing and signal analysis to calculate range and intensity in the digital domain.

In a first aspect, a system is provided. The system includes a plurality of macropixels. Each macropixel of the plurality of macropixels includes an array of single photon avalanche diodes (SPADs). Each SPAD is configured to provide a respective photosignal when triggered in response to detecting light from an external environment of the system. The system also includes a plurality of pipelined adders. Each pipelined adder of the plurality of pipelined adders is communicatively coupled to a respective portion of the plurality of macropixels. The system additionally includes a controller having a memory and at least one processor. The at least one processor executes instructions stored in the memory so as to carry out operations. The operations include, during a listening period, receiving, at each pipelined adder of the plurality of pipelined adders, respective photosignals from the respective portion of the plurality of macropixels. The operations also include causing each pipelined adder of the plurality of pipelined adders to provide an output based on the respective photosignals from the respective portion of the plurality of macropixels. The output includes a series of frames. Each frame of the series of frames includes an average number of SPAD devices of the respective portion of the plurality of macropixels that were triggered during a given listening period.

In a second aspect, a method is provided. The method includes, during a listening period, receiving, at each pipelined adder of a plurality of pipelined adders, respective photosignals from a respective portion of a plurality of macropixels. Each macropixel of the plurality of macropixels includes an array of single photon avalanche diodes (SPADs). Each SPAD is configured to provide a respective photosignal when triggered in response to detecting light from an external environment. Each pipelined adder of the plurality of pipelined adders is communicatively coupled to a respective portion of the plurality of macropixels. The method also includes causing each pipelined adder of the plurality of pipelined adders to provide an output based on the respective photosignals from the respective portion of the plurality of macropixels. The output includes a series of frames and each frame of the series of frames includes an average number of SPAD devices of the respective portion of the plurality of macropixels that were triggered during a given listening period.

Other aspects, embodiments, and implementations will become apparent to those of ordinary skill in the art by reading the following detailed description, with reference where appropriate to the accompanying drawings.

DETAILED DESCRIPTION

Example methods, devices, and systems are described herein. It should be understood that the words "example" and "exemplary" are used herein to mean "serving as an example, instance, or illustration." Any embodiment or feature described herein as being an "example" or "exemplary" is not necessarily to be construed as preferred or advantageous over other embodiments or features. Other embodiments can be utilized, and other changes can be made, without departing from the scope of the subject matter presented herein.

Thus, the example embodiments described herein are not meant to be limiting. Aspects of the present disclosure, as generally described herein, and illustrated in the figures, can be arranged, substituted, combined, separated, and designed in a wide variety of different configurations, all of which are contemplated herein.

Further, unless context suggests otherwise, the features illustrated in each of the figures may be used in combination with one another. Thus, the figures should be generally viewed as component aspects of one or more overall embodiments, with the understanding that not all illustrated features are necessary for each embodiment.

I. Overview

Single photon avalanche diodes (SPADs) may be fabricated in one- or two-dimensional array formats. Such SPAD detector arrays may be utilized with Light Detection and Ranging (LIDAR) systems to obtain information about an environment around the LIDAR system. In some cases, LIDAR systems described herein may be operable with autonomous or semi-autonomous vehicles.

In some embodiments, each SPAD array may include thousands of cell elements (e.g., 1024, 2048, or more cell elements). In such scenarios, the output of the SPAD array may include a digital or pseudo-digital (e.g., an analog stair step signal) waveform that may include information indicating how many SPAD cell elements of the array have been triggered in any given "listening period" (e.g., 2 microseconds) and a timestamp when each cell element is triggered. Accordingly, the output signal of a SPAD array may lend itself to all-digital processing.

In an example embodiment, the LIDAR system may include a plurality of light emitters (e.g., near-infrared lasers) and a plurality of SPAD arrays. Each SPAD array may correspond to a respective light emitter. In such a scenario, each light emitter may be configured to emit light pulses into an external environment. Upon interacting with objects in the environment, at least a portion of the light pulse may be reflected or scattered back toward the LIDAR system and the corresponding SPAD array. The corresponding SPAD array may be configured to detect at least a portion of the reflected light pulse.

Example systems and methods include a monolithic, single-chip receiver, which may be operable as an all-digital "LIDAR engine-on-a-chip." Exemplary systems and methods utilizing such architectures can function without a frontend with analog circuitry. Instead, the monolithic LIDAR receiver may be operable to receive the digital or digital-like signal from the SPAD arrays and perform other signal processing and signal analysis to calculate range and intensity in the digital domain.

In an example embodiment, a plurality of SPAD arrays (e.g., 16, 32, 64, or more arrays) may provide digital or digital-like signals to one or more adder stages, a buffer, and a data pipeline. The data pipeline may be coupled to a fast memory, such as an SRAM block. In such scenarios, the adder stages and pipeline may provide averaged frames in a serial or parallel manner to the memory. In some embodiments, each frame may include an average number of SPAD cell elements triggered over two or more listening periods for each SPAD array. In other embodiments, each frame may include, for each SPAD array, the number of SPAD cell elements triggered during each time bin (e.g., 400 picoseconds) of the listening period (e.g., 2 microseconds).

The memory may provide the averaged frames to a pulse processing block for processing. For example, the pulse processing block may be configured to process the frames to determine pulse arrival time (e.g., a time stamp to determine range), intensity, a first moment (e.g., a center of mass), and/or a second moment, which may help determine "mixed" pixels (where a light pulse hits the edge of an object). In some implementations, the pulse processing block may include approximately 200,000 resistor-transistor logic (RTL) gates, but different numbers and types of digital logic gates are possible and contemplated herein.

In example embodiments, the pulse processing block may convert the digital signal of each frame into an amplitude and range signal for each SPAD array. The pulse processing block and other elements of the system described herein may operate in a synchronous fashion, based on a system clock signal. As one example, the system clock signal may include a 400 picosecond (ps) clock period, but other periods are possible. In some examples, the system clock signal may be based on a variable clock, which may be adjustable to match and/or synchronize with a corresponding clock of a transmit block. In other embodiments, the transmit block and the pulse processing block may share the same clock signal/source.

After pulse processing, the output of the pulse processing block (which could include a partial or 360 degree point cloud of the environment around the system) may be provided to a high speed serial interface, such as a Peripheral Component Interconnect Express (PCIe) bus. The PCIe bus may provide a local communication link to a vehicle controller, a wireless communication interface, etc.

Optionally, interstitial cells, which may include SPAD cells of a first SPAD array in proximity to corresponding cells of a second SPAD array, could be disabled or ignored to avoid crosstalk between SPAD arrays. Furthermore, the SPAD arrays may be integrated with the pipeline, memory, digital logic, and/or high speed serial interface on the same wafer/chip. Additionally or alternatively, the SPAD arrays may be coupled to one or more of the other elements of the system by way of any number of three-dimensional chip or wafer scale hybridization techniques or backside fabrication techniques, such as, but not limited to, bump bonding, wafer bonding, and through-wafer vias (e.g., through-silicon via (TSV)), etc.

II. Example Systems

Figure 1A:
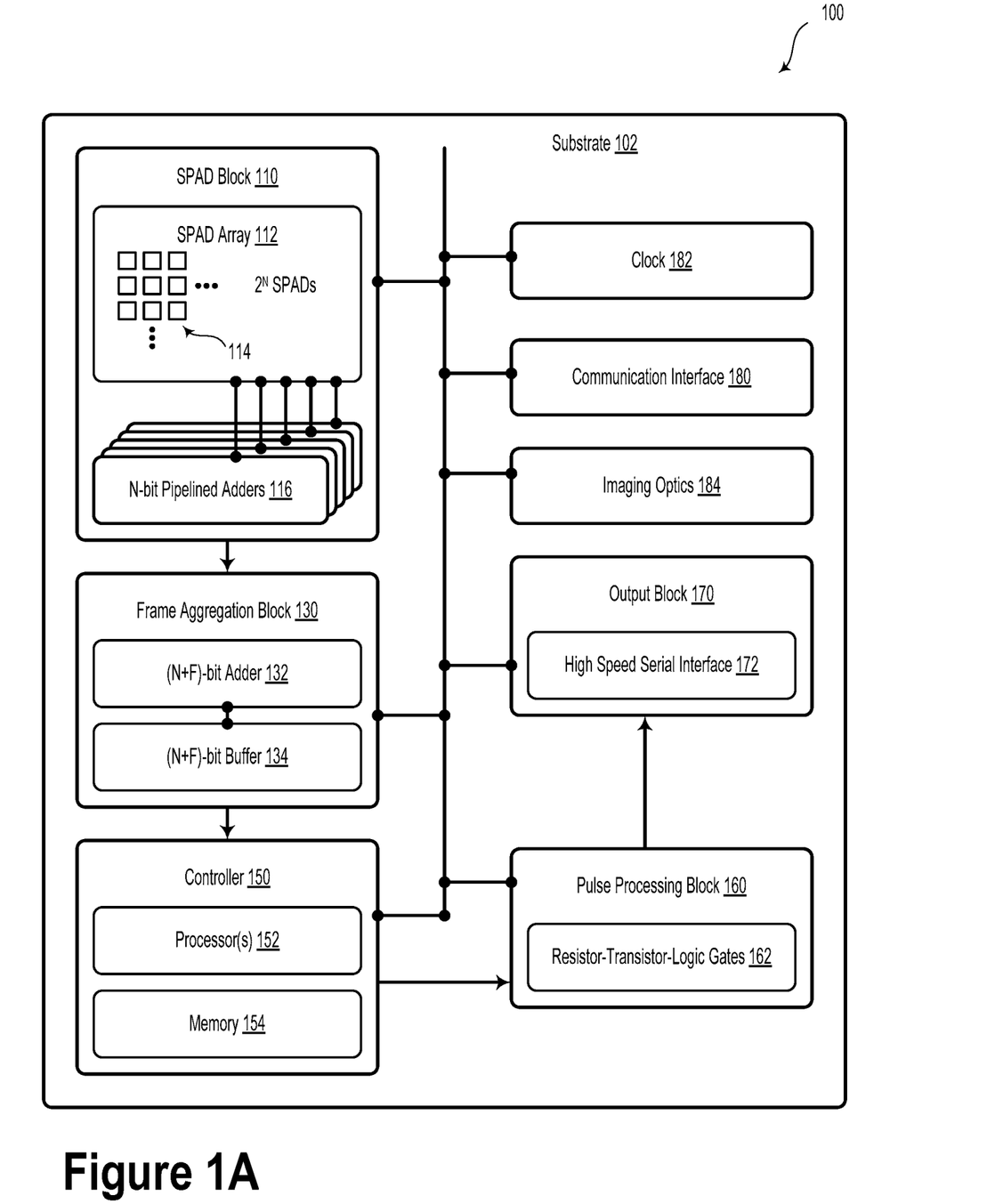
FIG. 1A illustrates a system, according to an example embodiment.
Figure 1B:
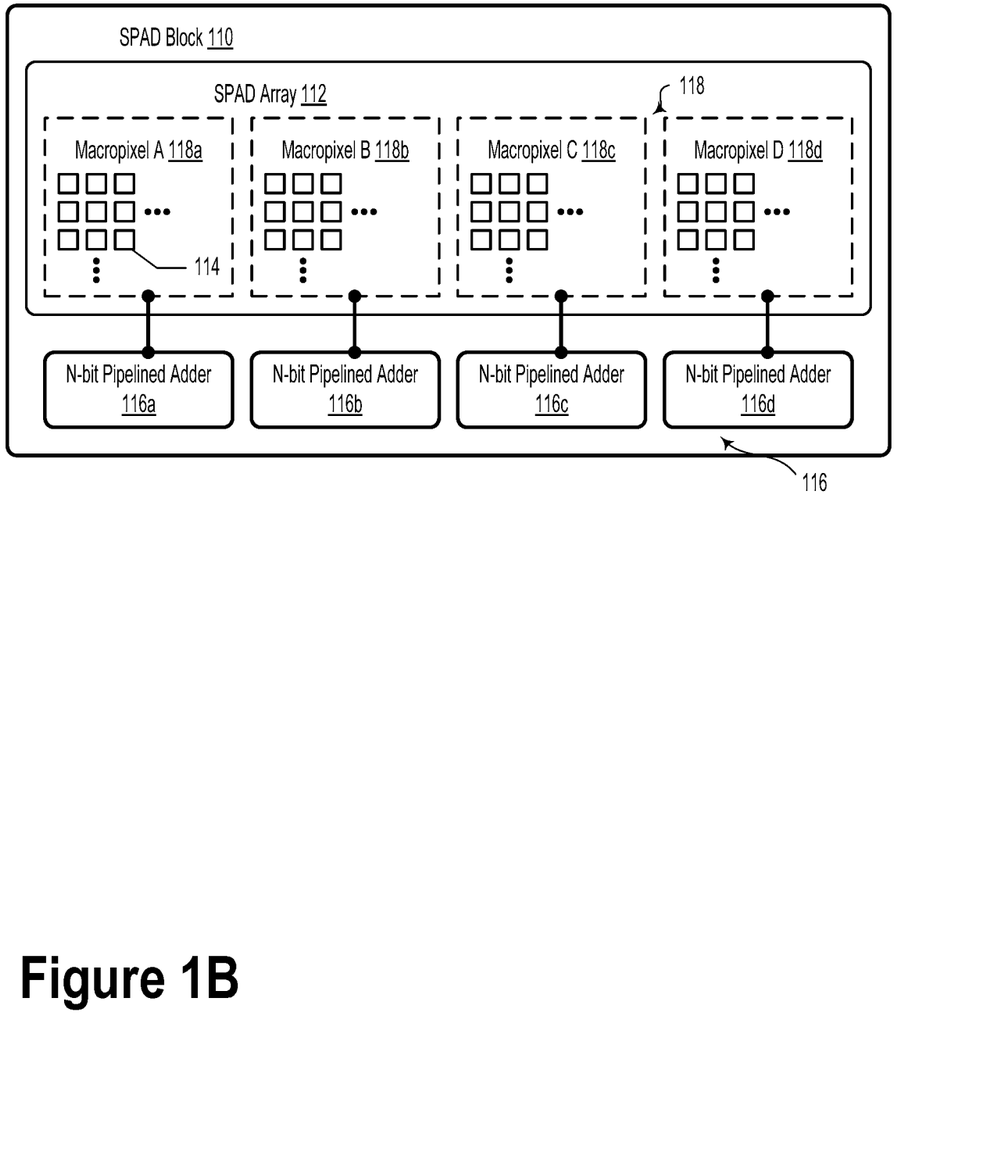
FIG. 1B illustrates a SPAD block, according to an example embodiment.

FIGS. 1A and 1B illustrate various portions of system 100, according to example embodiments. In some embodiments, system 100 may include a receiver subsystem for a light detection and ranging (LIDAR) system. Such a LIDAR system may be configured to provide information (e.g., point cloud data) about one or more objects (e.g., location, shape, etc.) in a given environment. In an example embodiment, the LIDAR system could provide point cloud information, object information, mapping information, or other information to a vehicle. The vehicle could be a semi- or fully-automated vehicle. For instance, the vehicle could be a self-driving car, an autonomous drone aircraft, an autonomous truck, or an autonomous robot. Other types of vehicles and LIDAR systems are contemplated herein.

As illustrated in FIG. 1A, some or all of the elements of system 100 could be disposed on a substrate 102. The substrate 102 could include a semiconductor wafer substrate (e.g., a silicon wafer), although other materials and substrate types are possible.

In some embodiments, the substrate 102 may include a first surface. In such scenarios, the first surface could be disposed along a primary plane of the substrate 102 and some or all of the elements of system 100 could be disposed along the first surface of substrate 102.

System 100 includes a SPAD block 110. The SPAD block 110 includes a SPAD array 112. The SPAD array 112 includes a plurality of SPAD devices 114 disposed in a two-dimensional array format (e.g., square array, rectangular array, hexagonal close packed array, or an irregular array). Each SPAD of the plurality of SPAD devices 114 is configured to provide a respective photosignal when triggered in response to detecting light from an external environment of the system 100. For example, each SPAD may be configured to detect light comprising a wavelength of at least one of: 1550 nm or 780 nm. It will be understood that other wavelengths are possible and contemplated herein. Furthermore, while SPAD devices are discussed specifically in the present disclosure, other photodetector types are also possible.

In an example embodiment, the SPAD array 112 may include $2^N$ SPAD devices. For example, in some embodiments, N could be 10 or 11. That is, the SPAD array 112 could include 1024 or 2048 SPAD devices 114. It will be understood that larger or smaller values of N and a larger or smaller corresponding number of SPAD devices 114 are possible and contemplated.

The SPAD devices in the SPAD array 112 are configured to detect light from a shared field of view. In an example embodiment, the system 100 may include imaging optics 184. In such scenarios, the SPAD array 112 may be operable to detect light from the shared field of view by way of the imaging optics 184.

Turning to FIG. 1B, SPAD block 110 could include a SPAD array 112, which may be partitioned, demarcated, or otherwise separated into a plurality of macropixels 118, according to an example embodiment. In such a scenario, each macropixel (e.g., macropixel A 118a, macropixel B 118b, macropixel C 118c, and macropixel D 118d) of the plurality of macropixels 118 includes an array of SPAD devices. In other words, the SPAD array 112 may be segmented into a plurality of macropixels 118, each consisting of respective portions of the SPAD array 112.

Furthermore, as illustrated and described with reference to FIG. 1A, a plurality of pipelined adders 116 may be communicatively coupled to the macropixels 118. For example, each pipelined adder (e.g., N-bit pipelined adders 116a-d) may be communicatively coupled to a respective macropixel 118a-d.

In an example embodiment, each macropixel (e.g., macropixel 118a-d) may have a photon detection efficiency of at least 8%. The photon detection efficiency for a given macropixel may be the photon detection probability (PDP) of the SPADs of the given macropixel multiplied by a SPAD fill factor (e.g., active SPAD area/total area).

Returning to FIG. 1A, the system 100 includes a plurality of N-bit pipelined adders 116. The N-bit pipelined adders 116 are coupled to respective portions of the SPAD array 112. That is, respective portions of the plurality of SPAD devices 114 may be communicatively coupled to respective N-bit pipelined adder 116. In an example embodiment, each pipelined adder 116 could be a 10-bit pipelined adder or an 11-bit pipelined adder. Other bit accuracy adders are possible and contemplated.

System 100 also includes a frame aggregation block 130. The frame aggregation block 130 is communicatively coupled to the plurality of N-bit pipelined adders 116. The frame aggregation block 130 may include devices configured to aggregate and/or buffer successive data frames. The frame aggregation block 130 could include an adder circuit and/or a digital buffer circuit configured to buffer at least $2^F$ successive data frames, where F is at least six. It will be understood that F may be greater than, or less than, six.

The adder circuit may include a plurality of (N+F)-bit adders 132 and the digital buffer circuit may include a plurality of (N+F)-bit buffers 134. In an example embodiment, the frame aggregation block 130 may be configured to aggregate a maximum number of frames, up to, and including $2^F$ data frames.

System 100 include a controller 150 having a memory 154 and at least one processor 152. In an example embodiment, the memory 154 comprises a static random access memory block comprising at least 5 kilobytes*(N+F), where F is at least 6. The at least one processor 152 may include, for instance, an application-specific integrated circuit (ASIC) or a field-programmable gate array (FPGA). Other types of processors, computers, or devices configured to carry out software instructions are contemplated herein. The memory 154 may include a non-transitory computer-readable medium, such as, but not limited to, read-only memory (ROM), programmable read-only memory (PROM), erasable programmable read-only memory (EPROM), electrically erasable programmable read-only memory (EEPROM), non-volatile random-access memory (e.g., flash memory), a solid state drive (SSD), a hard disk drive (HDD), a Compact Disc (CD), a Digital Video Disk (DVD), a digital tape, read/write (R/W) CDs, R/W DVDs, etc.

The controller 150 may include a computer disposed on a vehicle, an external computer, or a mobile computing platform, such as a smartphone, tablet device, personal computer, wearable device, etc. Additionally or alternatively, the controller 150 may include, or be connected to, a remotely-located computer system, such as a cloud server. In an example embodiment, the controller 150 may be configured to carry out some or all method blocks or steps described herein.

As an example, the at least one processor 152 may execute instructions stored in the memory 154 so as to carry out certain operations. The operations may include some or all of the functions, blocks, or steps described herein. In some embodiments, different computing devices or controllers may carry out the various functions, blocks, or steps described herein, in various combinations.

For example, the operations could include, during a listening period, receiving, at each pipelined adder of the plurality of N-bit pipelined adders 116, respective photosignals from the respective portion of the plurality of SPAD array 112 or macropixels 118a-d. While four macropixels are illustrated in FIG. 1B, it is understood that more or fewer macropixels are possible and contemplated herein. For instance, in some embodiments, the plurality of macropixels 118 may include at least one of: 16, 32, or 64 macropixels.

In some embodiments, each macropixel (e.g., macropixel 118a-d) could include 1024 or 2048 SPADs. It will be understood that other embodiments may include macropixels that include more or fewer SPAD elements. The number of SPAD elements per macropixel may be based on, among other possibilities, a desired dynamic range, a desired background illumination immunity, a desired signal to noise ratio (SNR), a present or anticipated imaging scenario, and/or other system-level considerations of the LIDAR system.

In an example embodiment, each macropixel may correspond to an individual LIDAR channel. For example, a LIDAR system may include 16, 32, or 256 light-emitter/detector pairs, or more. Each light-emitter/detector pair may be considered a single channel of such a LIDAR system. In such a scenario, a macropixel may be configured to low-level light sensing capability for each LIDAR channel. Namely, the respective macropixels may be configured to operate on a non-imaging, photon-aggregating basis to assist in the evaluation of time-of-flight ranging functions.

The operations include causing each pipelined adder (e.g., N-bit pipelined adder 116a-d) of the plurality of pipelined adders 116 to provide an output based on the respective photosignals from the respective portion of the plurality of macropixels 118. The output includes a series of frames. In such a scenario, each frame of the series of frames may include an average number of SPAD devices of the respective portion of the plurality of macropixels 118 that were triggered during a given listening period.

In an example embodiment, the listening period may be within an inclusive range of 300-500 picoseconds. It will be understood the listening period could include another duration or range of durations. Such other embodiments are all contemplated herein.

In an example embodiment, the plurality of macropixels 118, the plurality of pipelined adders 116, and the controller 150 may be disposed on the substrate 102 so as to provide a monolithic, single chip receiver.

In some embodiments, the system 100 may additionally include a pulse processing block 160 communicatively coupled to the frame aggregation block 130. In such scenarios, the controller 150 could be configured to carry out additional operations such as causing the pulse processing block 160 to determine, based on the series of frames, at least one of: a pulse arrival time or a pulse intensity. In some examples, the pulse processing block 160 may include at least 200,000 resistor-transistor logic (RTL) gates. It will be understood that more or fewer RTL gates are possible and contemplated herein.

In some example embodiments, the system 100 also includes an output block 170. The output block 170 may be communicatively coupled to the pulse processing block 160. The output block 170 includes a high speed serial interface 172. In such scenarios, the controller 150 may be configured to carry out further operations such as causing the output block 170 to provide a serial output based on the processed series of frames. The serial output could be provided to, for example, an object recognition block, a navigation block, or another type of vehicle awareness/action process or algorithm.

In an example embodiment, the high speed serial interface 172 includes a Peripheral Component Interconnect Express (PCIe) bus communicatively coupled to at least one of: a vehicle controller or a wireless communication interface (e.g., communication interface 180).

In some embodiments, the system 100 includes a clock 182. The clock 182 may be configured to provide a local and/or global clock signal or signals. At least some operations associated with the plurality of macropixels 118, the plurality of pipelined adders 116, the frame aggregation block 130, the pulse processing block 160, and the output block 170 are based on the clock signal.

System 100 may include a communication interface 180. The communication interface 180 may be configured to provide a communication link between various elements of system 100 such as the controller 150, the SPAD block 110, the frame aggregation block 130, the pulse processing block 160, the output block 170, the imaging optics 184, the clock 182, one or more computing networks, and/or other vehicles.

The communication interface 180 could be, for example, a system configured to provide wired or wireless communication between one or more other vehicles, sensors, or other elements described herein, either directly or via a communication network. To this end, the communication interface 180 may include an antenna and a chipset for communicating with the other vehicles, sensors, servers, or other entities either directly or via the communication network. The chipset or communication interface 180 in general may be arranged to communicate according to one or more types of wireless communication (e.g., protocols) such as BLUETOOTH, BLUETOOTH LOW ENERGY (BLE), communication protocols described in IEEE 802.11 (including any IEEE 802.11 revisions), cellular technology (such as GSM, CDMA, UMTS, EV-DO, WiMAX, or LTE), ZIGBEE, dedicated short range communications (DSRC), and radio frequency identification (RFID) communications, among other possibilities. The communication interface 180 may take other forms as well.

Figure 2:
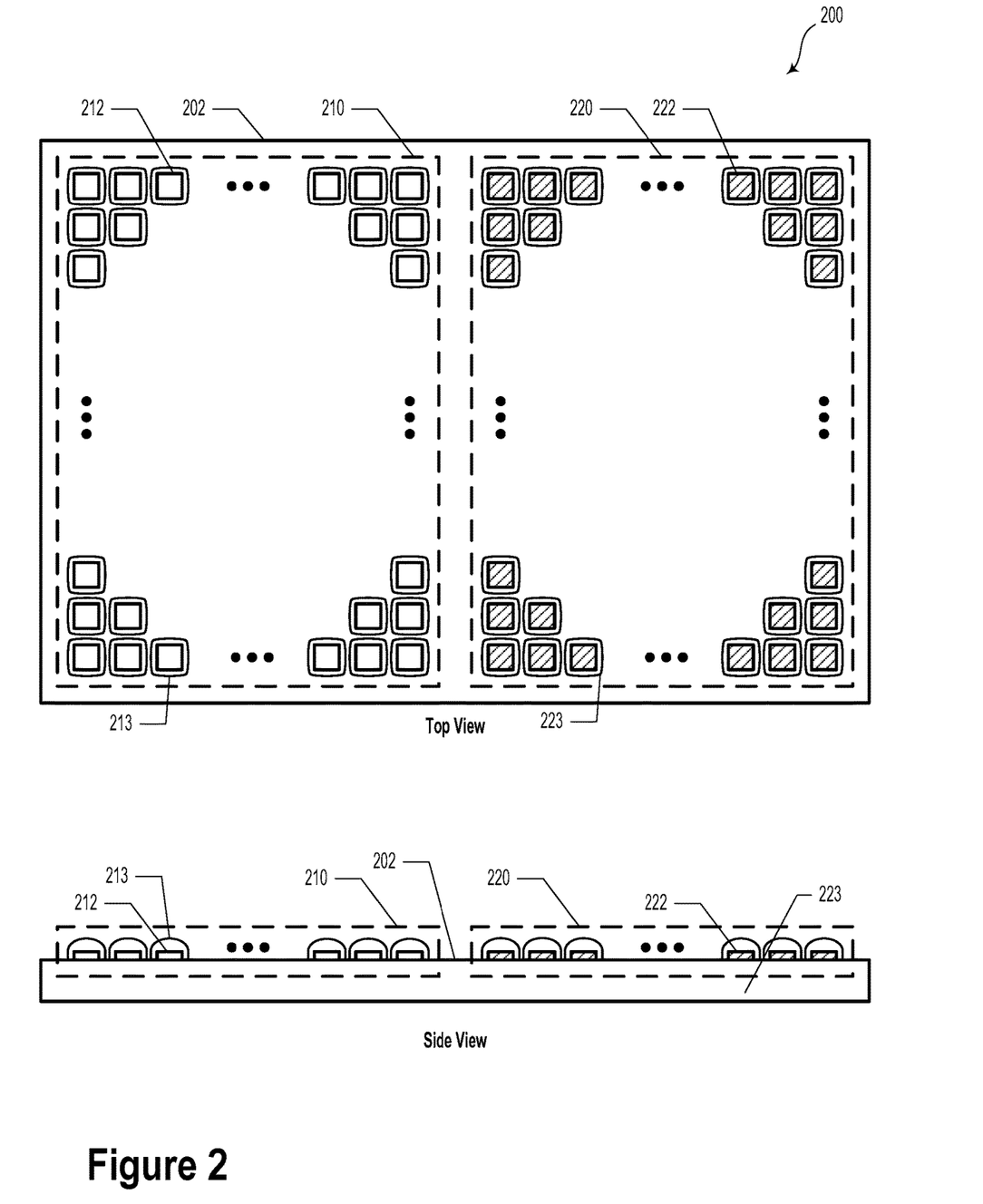
FIG. 2 illustrates a system, according to an example embodiment.

FIG. 2 illustrates a system 200, according to an example embodiment. System 200 illustrates a possible arrangement of SPAD devices as described herein. In some embodiments, system 200 may be similar or identical to SPAD block 110 or SPAD array 112 as illustrated and described with reference to FIG. 1A.

System 200 may include a substrate 202, a first macropixel 210, and a second macropixel 220. The first macropixel 210 may include a first plurality of SPAD devices 212 and the second macropixel 220 may include a second plurality of SPAD devices 222. In some embodiments, the SPAD devices 212 and 222 could be disposed along a surface of substrate 202 in a square array or a rectangular array. Other arrangements are possible, such as a hexagonal-close packed array or an irregular array. It will be understood that while two macropixels 210 and 220 are illustrated in FIG. 2, more or fewer macropixels are contemplated within the context of the present disclosure.

In some embodiments, the SPAD devices 212 and 222 could be optically coupled to respective microlenses 213 and 223. That is, in some examples, a microlens array could be coupled to each macropixel. The microlenses 213 and 223 could include refractive or diffractive optics. Other types of optical devices are possible. For example, the optical devices could be configured to focus light, collimate light, diverge light, or otherwise adjust an optical path between the external environment and the respective SPAD devices 212 and 22.

Although not illustrated herein, in some example embodiments, the respective SPADs of the plurality of SPAD devices 114 could be coupled to photodetector output circuitry (e.g., a readout integrated circuit (ROIC)) on a second substrate by way of, for example, respective arrays of through-wafer vias and/or bump bonds. Other embodiments involving detector/circuitry hybridization are contemplated herein.

Figure 3:
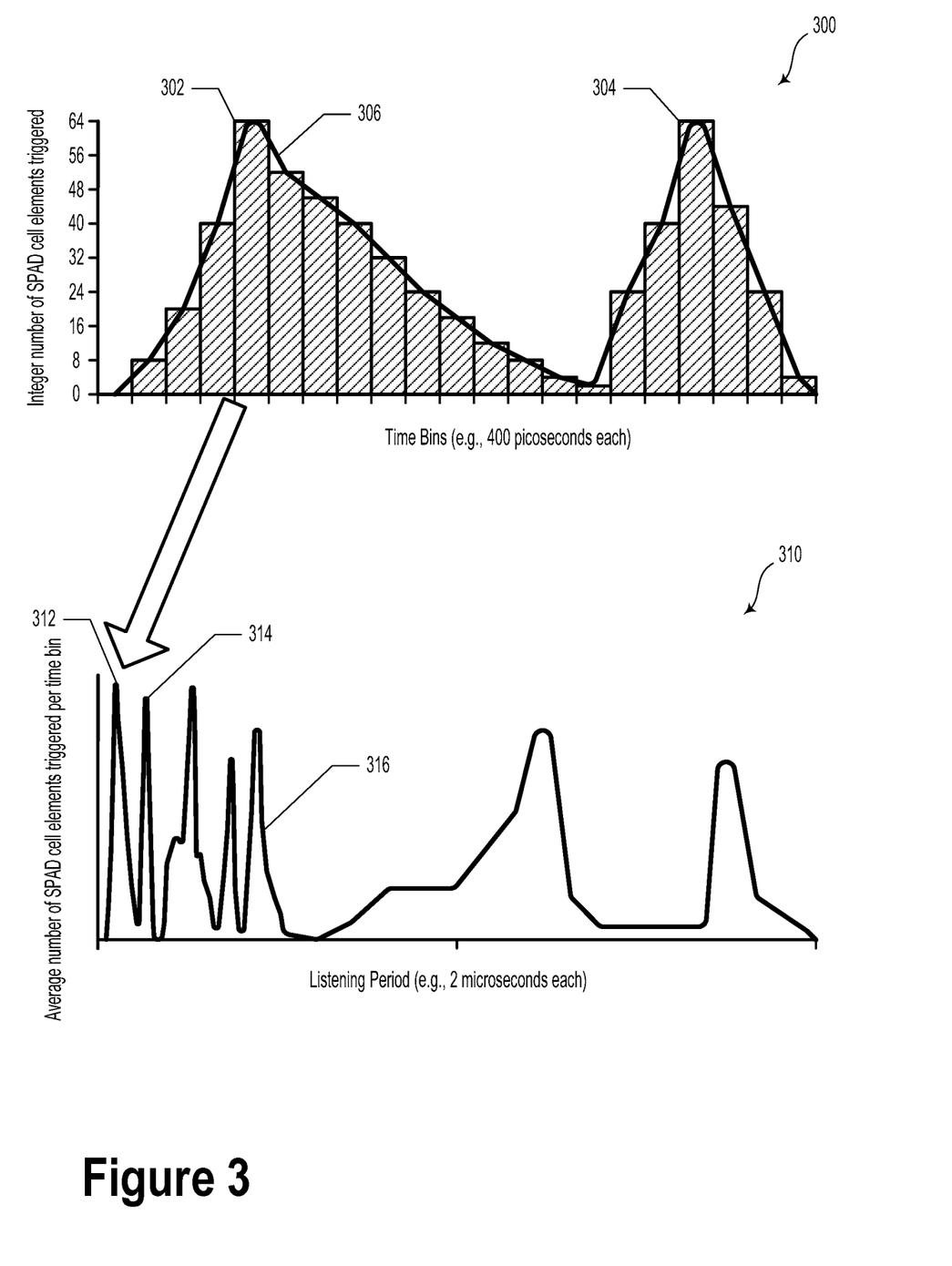
FIG. 3 illustrates several graphs, according to example embodiments.

FIG. 3 illustrates graph 300 and graph 310, according to example embodiments. Graph 300 includes an integer number of SPAD cell elements triggered during respective time bins. In some embodiments, the time bins could each be 400 picoseconds in duration, but other durations are possible and contemplated. As illustrated in graph 300, the data may include certain characteristic features, such as local peaks 302 and 304. Trendline 306 could indicate a rolling average number of SPAD cell elements triggered over time. Trendline 306 could include a digital or pseudo-digital (e.g., an analog stair step signal) waveform.

Graph 310 may include an average number of SPAD cell elements triggered per time bin. Specifically, graph 310 may include a trendline 316 that includes the average number of triggered SPAD elements over one or more listening periods. In an example embodiment, the listening period could be 2 microseconds. However, longer and shorter listening periods are contemplated. As illustrated, graph 310 may include a time-compressed version of trendline 306, as illustrated and described with reference to FIG. 3. That is, local peaks 302 and 304 from graph 300 may be represented as local peaks 312 and 314 in graph 310. It will be understood that different scenes (e.g., due to various or changing objects in the field of view of the external environment) may provide different trendline shapes and values.

As described elsewhere herein, various features of trendline 306 and trendline 316 could be used to determine, for example, a distance to a given object in an external environment. Furthermore, trendline 306 and/or trendline 316 could be processed, at least in part, by the pulse processing block 160, or another element of system 100 as illustrated and described in FIG. 1. For example, the pulse processing block 160 could be configured to process one or more frames (e.g., information from one or more listening periods) so as to determine one or more pulse arrival times or time-of-flight measurements. Additionally or alternatively, the pulse processing block 160 could determine an intensity, first moment (e.g., center of mass), or a second moment (e.g., variance) based on the trendline 306 or trendline 316. Other types of processing could be performed by pulse processing block 160 so as to provide information about objects in the external environment (e.g., a point cloud).

III. Example Methods

Figure 4:
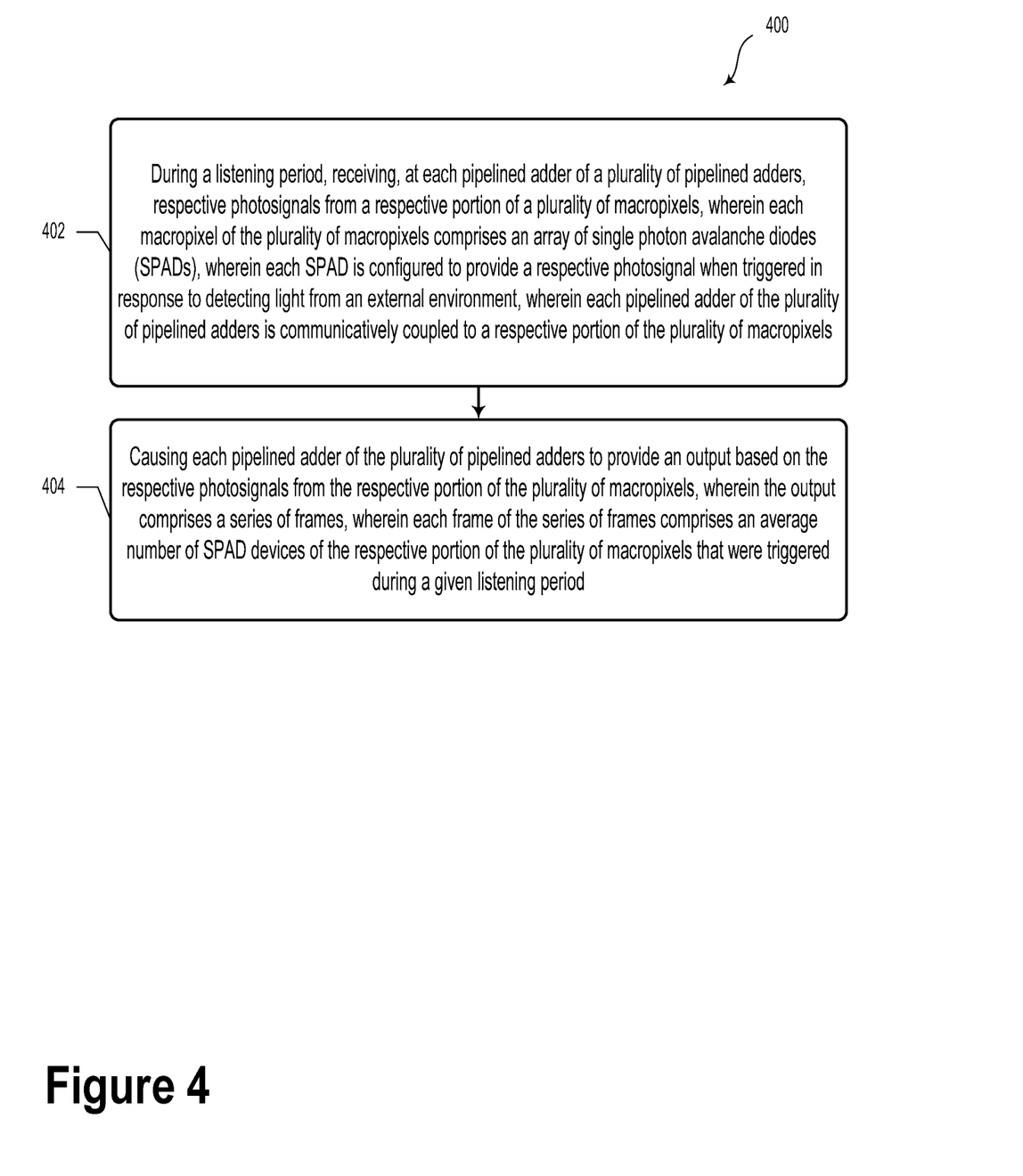
FIG. 4 illustrates a method, according to an example embodiment.

FIG. 4 illustrates a method 400, according to an example embodiment. Method 400 may be carried out, in full or in part, by system 100, SPAD block 110, controller 150, or system 200 as illustrated and described in reference to FIGS. 1A, 1B and 2. Method 400 may include elements that are similar or identical to those illustrated and described with reference to FIGS. 1A, 1B, and 2. It will be understood that the method 400 may include fewer or more steps or blocks than those expressly disclosed herein. Furthermore, respective steps or blocks of method 400 may be performed in any order and each step or block may be performed one or more times.

Block 402 includes during a listening period, receiving, at each pipelined adder of a plurality of pipelined adders, respective photosignals from a respective portion of a plurality of macropixels. Each macropixel of the plurality of macropixels includes an array of single photon avalanche diodes (SPADs). Each SPAD is configured to provide a respective photosignal when triggered in response to detecting light from an external environment. Each pipelined adder of the plurality of pipelined adders is communicatively coupled to a respective portion of the plurality of macropixels.

In embodiments that include a transmit block of a LIDAR system, a light source may emit light pulses, which may interact with objects in the external environment. The light source may be disposed proximate to the receiver block or disposed at another location. In an example embodiment, the light source could include one or more lasers configured to emit near infrared light pulses. At least a portion of the emitted light pulses may be reflected or scattered back to the SPAD devices by objects in the external environment. In such a scenario, the SPAD devices may receive reflected or scattered light that may be indicative of objects in the external environment.

Block 404 includes causing each pipelined adder of the plurality of pipelined adders to provide an output based on the respective photosignals from the respective portion of the plurality of macropixels. The output includes a series of frames and each frame of the series of frames includes an average number of SPAD devices of the respective portion of the plurality of macropixels that were triggered during a given listening period. In some embodiments, the output may be similar to that of graphs 300 and 310, as illustrated and described in FIG. 3.

The method 400 may optionally include causing a frame aggregation block to aggregate the series of frames. In such scenarios, the frame aggregation block includes an adder circuit and a digital buffer circuit, wherein a maximum number of aggregated frames is at least 2F, where F is at least 6.

Additionally or alternatively, method 400 may include causing a pulse processing block to determine, based on the series of frames, at least one of: a pulse arrival time or a pulse intensity. In such scenarios, the method 400 may optionally include causing an output block to provide a serial output based on the processed series of frames.

The particular arrangements shown in the Figures should not be viewed as limiting. It should be understood that other embodiments may include more or less of each element shown in a given Figure. Further, some of the illustrated elements may be combined or omitted. Yet further, an illustrative embodiment may include elements that are not illustrated in the Figures.

A step or block that represents a processing of information can correspond to circuitry that can be configured to perform the specific logical functions of a herein-described method or technique. Alternatively or additionally, a step or block that represents a processing of information can correspond to a module, a segment, a physical computer (e.g., a field programmable gate array (FPGA) or application-specific integrated circuit (ASIC)), or a portion of program code (including related data). The program code can include one or more instructions executable by a processor for implementing specific logical functions or actions in the method or technique. The program code and/or related data can be stored on any type of computer readable medium such as a storage device including a disk, hard drive, or other storage medium.

The computer readable medium can also include non-transitory computer readable media such as computer-readable media that store data for short periods of time like register memory, processor cache, and random access memory (RAM). The computer readable media can also include non-transitory computer readable media that store program code and/or data for longer periods of time. Thus, the computer readable media may include secondary or persistent long term storage, like read only memory (ROM), optical or magnetic disks, compact-disc read only memory (CD-ROM), for example. The computer readable media can also be any other volatile or non-volatile storage systems. A computer readable medium can be considered a computer readable storage medium, for example, or a tangible storage device.

While various examples and embodiments have been disclosed, other examples and embodiments will be apparent to those skilled in the art. The various disclosed examples and embodiments are for purposes of illustration and are not intended to be limiting, with the true scope being indicated by the following claims.

What is claimed is:

1. A system comprising:
    a plurality of macropixels, wherein each macropixel of the plurality of macropixels comprises an array of single photon avalanche diodes (SPADs), wherein each SPAD is configured to provide a respective photosignal when triggered in response to detecting light from an external environment of the system;
    a plurality of pipelined adders, wherein each pipelined adder of the plurality of pipelined adders is communicatively coupled to a respective portion of the plurality of macropixels; and
    a controller comprising a memory and at least one processor, wherein the at least one processor executes instructions stored in the memory so as to carry out operations, the operations comprising:
        during a listening period, receiving, at each pipelined adder of the plurality of pipelined adders, respective photosignals from the respective portion of the plurality of macropixels; and
        causing each pipelined adder of the plurality of pipelined adders to provide an output based on the respective photosignals from the respective portion of the plurality of macropixels, wherein the output comprises a series of frames, wherein each frame of the series of frames comprises an average number of SPADs of the respective portion of the plurality of macropixels that were triggered during a given listening period.

2. The system of claim 1, wherein the plurality of macropixels, the plurality of pipelined adders, and the controller are disposed on a substrate so as to provide a monolithic, single chip receiver.

3. The system of claim 1, wherein the plurality of macropixels comprises $2^N$ macropixels and the plurality of pipelined adders comprises N-bit pipelined adders, wherein N is at least 10.

4. The system of claim 3, further comprising a frame aggregation block communicatively coupled to the plurality of pipelined adders, wherein the operations further comprise causing the frame aggregation block to aggregate the series of frames, wherein the frame aggregation block comprises an adder circuit and a digital buffer circuit, wherein a maximum number of aggregated frames is at least $2^F$, wherein F is at least 6.

5. The system of claim 4, wherein the memory comprises a static random access memory block comprising at least 5 kilobytes*(N+F), wherein F is at least 6.

6. The system of claim 4, further comprising a pulse processing block communicatively coupled to the frame aggregation block, wherein the operations further comprise causing the pulse processing block to determine, based on the series of frames, at least one of: a pulse arrival time or a pulse intensity.

7. The system of claim 6, wherein the pulse processing block comprises at least 200,000 resistor-transistor logic (RTL) gates.

8. The system of claim 6, further comprising an output block, wherein the output block is communicatively coupled to the pulse processing block, wherein the output block comprises a high speed serial interface, wherein the operations further comprise causing the output block to provide a serial output based on the processed series of frames.

9. The system of claim 8, wherein the high speed serial interface comprises a Peripheral Component Interconnect Express (PCIe) bus communicatively coupled to at least one of: a vehicle controller or a wireless communication interface.

10. The system of claim 8, further comprising a clock configured to provide a clock signal, wherein at least some operations of: the plurality of macropixels, the plurality of pipelined adders, the frame aggregation block, the pulse processing block, and the output block are based on the clock signal.

11. The system of claim 1, wherein each SPAD is configured to detect light comprising a wavelength of at least one of: 1550 nm or 780 nm.

12. The system of claim 1, wherein a photon detection efficiency of each macropixel comprises a photon detection probability (PDP) of a given SPAD multiplied by a SPAD fill factor in a given macropixel, wherein the photon detection efficiency of each macropixel is at least 8%.

13. The system of claim 1, wherein the listening period is within an inclusive range of 300-500 picoseconds.

14. The system of claim 1, further comprising a microlens array coupled to each macropixel.

15. The system of claim 1, wherein each macropixel comprises at least one of: 1024 or 2048 SPADs.

16. The system of claim 1, wherein the plurality of macropixels comprises at least one of: 16, 32, or 64 macropixels.

17. A method comprising:
    during a listening period, receiving, at each pipelined adder of a plurality of pipelined adders, respective photosignals from a respective portion of a plurality of macropixels, wherein each macropixel of the plurality of macropixels comprises an array of single photon avalanche diodes (SPADs), wherein each SPAD is configured to provide a respective photosignal when triggered in response to detecting light from an external environment, wherein each pipelined adder of the plurality of pipelined adders is communicatively coupled to a respective portion of the plurality of macropixels; and
    causing each pipelined adder of the plurality of pipelined adders to provide an output based on the respective photosignals from the respective portion of the plurality of macropixels, wherein the output comprises a series of frames, wherein each frame of the series of frames comprises an average number of SPADs of the respective portion of the plurality of macropixels that were triggered during a given listening period.

18. The method of claim 17, further comprising causing a frame aggregation block to aggregate the series of frames, wherein the frame aggregation block comprises an adder circuit and a digital buffer circuit, wherein a maximum number of aggregated frames is at least $2^F$, wherein F is at least 6.

19. The method of claim 18, further comprising causing a pulse processing block to determine, based on the series of frames, at least one of: a pulse arrival time or a pulse intensity.

20. The method of claim 19, further comprising causing an output block to provide a serial output based on the processed series of frames.

* * * * *